United States Patent
Iwabuchi et al.

(10) Patent No.: US 10,755,959 B2
(45) Date of Patent: Aug. 25, 2020

(54) SUBSTRATE HOLDING DEVICE AND METHOD OF MANUFACTURING THE SAME

(71) Applicant: NGK SPARK PLUG CO., LTD., Nagoya, Aichi (JP)

(72) Inventors: Atsutoshi Iwabuchi, Tomiya (JP); Shinya Kikuchi, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 211 days.

(21) Appl. No.: 15/600,897

(22) Filed: May 22, 2017

(65) Prior Publication Data
US 2017/0345702 A1   Nov. 30, 2017

(30) Foreign Application Priority Data
May 26, 2016  (JP) ................. 2016-105587

(51) Int. Cl.
| | |
|---|---|
| *H01L 21/683* | (2006.01) |
| *B25J 15/06* | (2006.01) |
| *B65G 47/91* | (2006.01) |
| *H01L 21/687* | (2006.01) |
| *B65G 49/06* | (2006.01) |

(52) U.S. Cl.
CPC ...... *H01L 21/6838* (2013.01); *B25J 15/0616* (2013.01); *B65G 47/91* (2013.01); *B65G 49/061* (2013.01); *H01L 21/6875* (2013.01); *B25J 15/0683* (2013.01); *B65G 2249/04* (2013.01); *B65G 2249/045* (2013.01)

(58) Field of Classification Search
CPC ............. H01L 21/6838; H01L 21/6875; B25J 15/0616; B25J 19/007; B25J 15/0683; B25J 11/0095; B65G 47/91; B65G 49/061; B65G 2249/04; B65G 2249/045
USPC ......................... 294/183, 64.3, 213
See application file for complete search history.

(56) References Cited

U.S. PATENT DOCUMENTS

| | | | | | |
|---|---|---|---|---|---|
| 4,551,192 | A | * | 11/1985 | Di Milia ................. | G03F 7/707 118/731 |
| 4,711,014 | A | * | 12/1987 | Althouse ................. | B25B 11/00 125/13.01 |

(Continued)

FOREIGN PATENT DOCUMENTS

| | | | | |
|---|---|---|---|---|
| EP | 2806311 A1 | * | 11/2014 | ......... H01L 21/6838 |
| JP | H08-139169 A | | 5/1996 | |

(Continued)

OTHER PUBLICATIONS

Taiwan Intellectual Property Office, Office Action issued in corresponding Application No. 106117316, dated Aug. 29, 2019. (English translation not available.).

(Continued)

*Primary Examiner* — Dean J Kramer
(74) *Attorney, Agent, or Firm* — Stites & Harbison, PLLC; Jeffrey A. Haeberlin; James R. Hayne (57) ABSTRACT

A substrate holding device includes a base body that has a flat plate-like shape and that includes gas passages that open in an upper surface of the base body, and a plurality of protrusions that protrude from the upper surface of the base body. At least an upper part of each of the protrusions has a conical frustum shape having a base angle of 70° or more and 85° or less.

3 Claims, 4 Drawing Sheets (56) References Cited

U.S. PATENT DOCUMENTS

| | | | | |
|---|---|---|---|---|
| 4,852,926 A | * | 8/1989 | Littell | B25J 15/0616 294/189 |
| 5,456,756 A | * | 10/1995 | Ramaswami | C23C 14/50 118/503 |
| 5,777,838 A | * | 7/1998 | Tamagawa | H01L 21/6831 279/128 |
| 6,257,564 B1 | * | 7/2001 | Avneri | B25B 11/005 269/21 |
| 6,307,620 B1 | * | 10/2001 | Takabayashi | G03F 7/707 355/53 |
| 6,474,987 B1 | * | 11/2002 | Nakai | C23C 16/4583 211/41.18 |
| 6,541,187 B1 | | 4/2003 | Wang et al. | |
| 6,960,743 B2 | * | 11/2005 | Hiramatsu | H01L 21/67103 219/444.1 |
| 7,582,166 B2 | * | 9/2009 | Lampe | C23C 16/4581 118/724 |
| 7,705,968 B2 | * | 4/2010 | Nagasaka | G03F 7/11 355/30 |
| 8,089,615 B2 | * | 1/2012 | Mizutani | G03F 7/70341 279/3 |
| 9,423,699 B2 | * | 8/2016 | Lafarre | G03F 7/70341 |
| 2002/0124964 A1 | * | 9/2002 | Ahn | C23C 16/4581 156/345.51 |
| 2003/0047283 A1 | * | 3/2003 | Parkhe | C23C 16/4581 156/345.51 |
| 2003/0168174 A1 | * | 9/2003 | Foree | C23C 16/45521 156/345.51 |
| 2003/0178547 A1 | | 9/2003 | Wang et al. | |
| 2007/0222131 A1 | * | 9/2007 | Fukumoto | B25B 11/005 269/21 |
| 2007/0285647 A1 | | 12/2007 | Kwan et al. | |
| 2007/0289124 A1 | * | 12/2007 | Oh | B24B 37/30 29/729 |
| 2008/0138504 A1 | * | 6/2008 | Williams | C23C 14/048 427/96.2 |
| 2008/0268753 A1 | * | 10/2008 | Ishikawa | B24B 37/30 451/36 |
| 2009/0079525 A1 | * | 3/2009 | Sijben | G03F 7/70708 335/72 |
| 2010/0061032 A1 | * | 3/2010 | Hirahara | H01L 21/6831 361/234 |
| 2013/0201597 A1 | * | 8/2013 | Ishikawa | H01L 21/6833 361/234 |
| 2016/0354864 A1 | * | 12/2016 | Hammer | B23K 26/352 |
| 2017/0084477 A1 | * | 3/2017 | Kang | H01L 21/6838 |
| 2017/0243778 A1 | * | 8/2017 | Kouno | H01L 21/3065 |
| 2018/0005860 A1 | * | 1/2018 | Miyamoto | H01L 21/6833 |
| 2018/0096878 A1 | * | 4/2018 | Wu | H01L 21/6838 |
| 2018/0130692 A1 | * | 5/2018 | Ishino | G03F 7/20 |
| 2018/0190534 A1 | * | 7/2018 | Poiesz | G03F 7/707 |
| 2018/0211861 A1 | * | 7/2018 | Schmidt | H01L 21/6833 |

FOREIGN PATENT DOCUMENTS

| | | | | | |
|---|---|---|---|---|---|
| JP | H10-242255 A | | 9/1998 | | |
| JP | 2007158168 A | * | 6/2007 | | F27D 5/0037 |
| JP | 2007258443 A | * | 10/2007 | | B25B 11/005 |
| JP | 2007266611 A | | 10/2007 | | |
| JP | 2010103496 A | * | 5/2010 | | H01L 21/6831 |
| JP | 2011-082579 A | | 4/2011 | | |
| JP | 2012-009720 A | | 1/2012 | | |
| JP | 5597524 B2 | | 10/2014 | | |
| TW | I291601 B | | 12/2007 | | |

OTHER PUBLICATIONS

Japan Patent Office, Office Action (Notice of Reasons for Refusal) issued in corresponding Application No. 2016-105587, dated Oct. 8, 2019.

Korean Intellectual Property Office, Office Action issued in corresponding Application No. 10-2017-0062503, dated Jun. 4, 2019. (English translation not available).

* cited by examiner

SUBSTRATE HOLDING DEVICE AND METHOD OF MANUFACTURING THE SAME

CROSS-REFERENCE TO RELATED APPLICATION

The present application claims priority to Japanese Patent Application No. 2016-105587, which was filed on May 26, 2016, the disclosure of which is herein incorporated by reference in its entirety.

BACKGROUND OF THE INVENTION

1. Field of the Invention

The present invention relates to a substrate holding device for holding a substrate, such as a semiconductor wafer, on a base body by suction and a method of manufacturing the same.

2. Description of the Related Art

In semiconductor manufacturing systems and the like, a substrate holding device having the following structure has been used: the substrate holding device includes a base body and a large number of protrusions (pins), for supporting a substrate, that are formed on an upper surface of the base body, and openings of gas passages that are connected to a vacuum sucking device are formed in the upper surface. The protrusions are formed by abrasive blasting. Due to this manufacturing process, each of the protrusions inevitably has a conical frustum shape having a base angle of about 45°, and it is not possible to form protrusions having a solid cylindrical shape (see, for example, PTL 1).

If particles are present between the protrusions and the substrate, some parts of the substrate are lifted and the surface irregularity of the substrate increases. In recent years, components of semiconductor devices have become smaller and have been arranged with increasingly higher density. Therefore, if the surface irregularity of the substrate increases, for example, exposure becomes out of focus and a blurred exposure pattern is formed. Then, a short circuit may occur in a circuit pattern formed on the substrate and a problem of a decrease in the production yield arises.

There has been proposed a method of forming grooves in top surfaces of the protrusions to reduce the contact area between the protrusions and the substrate and thereby to reduce the frequency of occurrence of entry of particles into spaces between the protrusions and the substrate (see, for example, PTL 2).

PATENT LITERATURE

PTL 1 is Japanese Unexamined Patent Application Publication No. 10-242255.
PTL 2 is Japanese Unexamined Patent Application Publication No. 2012-009720.

BRIEF SUMMARY OF THE INVENTION

However, when the contact area between the protrusions and the substrate is reduced, top portions of the protrusions, which are in contact the substrate, wear easily and the surface roughness of the top portions increases. Therefore, polishing of the top portions is performed. However, since each of the protrusions has a conical frustum shape having a base angle of about 45°, the contact area increases considerably every time the top portions are polished, and the probability that the particles are present between the protrusions and the substrate increases.

Moreover, it is very difficult to form grooves in the top surfaces of the protrusions and economically disadvantageous.

An object of the present invention is to provide a substrate holding device that can suppress an increase in the probability that particles are present between protrusions and a substrate, even when top portions of the protrusions are polished, without performing difficult processing and to provide a method of manufacturing the substrate holding device.

A substrate holding device according to the present invention includes a base body that has a flat plate-like shape and that includes a gas passage that opens in an upper surface of the base body, and a plurality of protrusions that protrude from the upper surface of the base body. In other words, the base body includes an upper surface and a plurality of protrusions that protrude from the upper surface, and defines the gas passage that opens in the upper surface. At least an upper part of each of the protrusions has a conical frustum shape having a base angle of 70° or more and 85° or less (i.e., the base angle is between 70° and 85°).

With the substrate holding device according to the present invention, each of the protrusions has a sharp conical frustum shape having a base angle of 70° or more and 85° or less, in contrast to protrusions of existing substrate holding devices, each of which having a blunt conical frustum shape having a base angle of about 45°. Therefore, even when the top portions are polished, an increase of the contact area between the protrusions and the substrate is suppressed, and it is possible to reduce the probability that particles adhere to the top surfaces of the protrusions after being polished.

It is possible to form the protrusions, each having a sharp conical frustum shape having a base angle of 70° or more and 85° or less, by laser processing. Therefore, it is easier to form the protrusions than to form grooves in the top surfaces of the protrusions. In the present invention, the term "conical frustum shape" not only refers to a conical frustum shape that is mathematically rigorously defined but also includes the meaning of substantially conical frustum shapes such as those having rounded corners or irregular side surfaces. The meaning of the term also includes a shape having a step between a lower part and an upper part thereof.

It is sufficient that at least an upper part of each of the protrusions has a conical frustum shape having a base angle of 70° or more and 85° or less. For example, the entirety of the protrusion may have a conical frustum shape having a base angle of 70° or more and 85° or less. An upper part of the protrusion may have a conical frustum shape having a base angle of 70° or more and 85° or less, and a lower part of the protrusion may have a conical frustum shape having a base angle of less than 70°.

In the substrate holding device according to the present invention, preferably, a ratio of a height of each of the protrusions to a maximum width of a contact surface between the substrate and the protrusion is 1 or more, a ratio of a total contact area between the substrate and the protrusions to an area of the substrate is 0.30% or less, and a center-to-center distance between the protrusions that are located adjacent to each other is 3.0 mm or less. In other words, each of the plurality of protrusions preferably includes a top surface for contacting the substrate, a ratio of a height of each of the protrusions to a maximum width of the top surface is 1 or more, a ratio of a total contact area between the substrate and the plurality of protrusions to an area of the substrate is 0.30% or less, and center-to-center distances between adjacent protrusions are 3.0 mm or less.

In this case, as can be clearly understood from the Examples described below, as long as the above conditions are satisfied, it is possible to prevent an increase of the surface irregularity of the substrate while reducing the number of particles that are present between the protrusions and the substrate.

A method of manufacturing a substrate holding device according to the present invention includes forming a plurality of protrusions on an upper surface of a base body by laser processing, each of the protrusions having a conical frustum shape having a base angle of 70° or more and 85° or less (i.e., between 70° and)85° in at least an upper part thereof.

With the method of manufacturing a substrate holding device according to the present invention, each of the protrusions has a sharp conical frustum shape having a base angle of 70° or more and 85° or less, in contrast to protrusions of existing substrate holding devices, each of which having a blunt conical frustum shape having a base angle of about 45°. Therefore, even when the top portions are polished, an increase of the contact area between the protrusions and the substrate is suppressed, and it is possible to reduce the probability that particles adhere to the top surfaces of the protrusions after being polished.

The protrusions, each having a sharp conical frustum shape having a base angle of 70° or more and 85° or less, are formed by laser processing. Therefore, it is easier to form the protrusions than to form grooves in the top surfaces of the protrusions.

In the method of manufacturing a substrate holding device according to the present invention, preferably, forming the plurality of protrusions includes forming a plurality of conical-frustum-shaped protruding portions, each having a base angle of 45° or more and 70° or less, on the upper surface of the base body by abrasive blasting (i.e., forming, by abrasive blasting, a plurality of conical-frustum-shaped protruding portions), and forming a conical frustum shape, having a base angle of 70° or more and 85° or less, in an upper part of each of the plurality of conical-frustum-shaped protruding portions by laser processing (i.e., forming, by laser processing, an upper part of each of the plurality of conical-frustum-shaped protruding portions).

In this case, it is possible to form the protrusions in a shorter time and at a lower cost than in a case of forming the entirety of the protrusions by laser processing.

DETAILED DESCRIPTION OF EXEMPLARY EMBODIMENTS OF THE INVENTION

Substrate Holding Device

First, referring to FIGS. 1 and 2, a substrate holding device 100 according to an embodiment of the present invention will be described.

The substrate holding device 100 includes a base body 10, having a substantially flat plate-like shape, for holding a substrate (wafer) W by suction. The base body 10 is made from a ceramic sintered compact so as to have the substantially flat plate-like shape. Instead of the substantially disk-like shape, the base body 10 may have any appropriate shape, such as a polygonal plate-like shape or an elliptical plate-like shape.

Gas passages 11 that open in an upper surface (front surface) of the base body 10 are formed in the base body 10. The gas passages 11 may be connected to passages that extend through the inside of the base body 10 or to passages that extend to a lower surface (back surface) of the base body 10. The gas passages 11 are connected to a vacuum sucking device (not shown).

Figure 2:
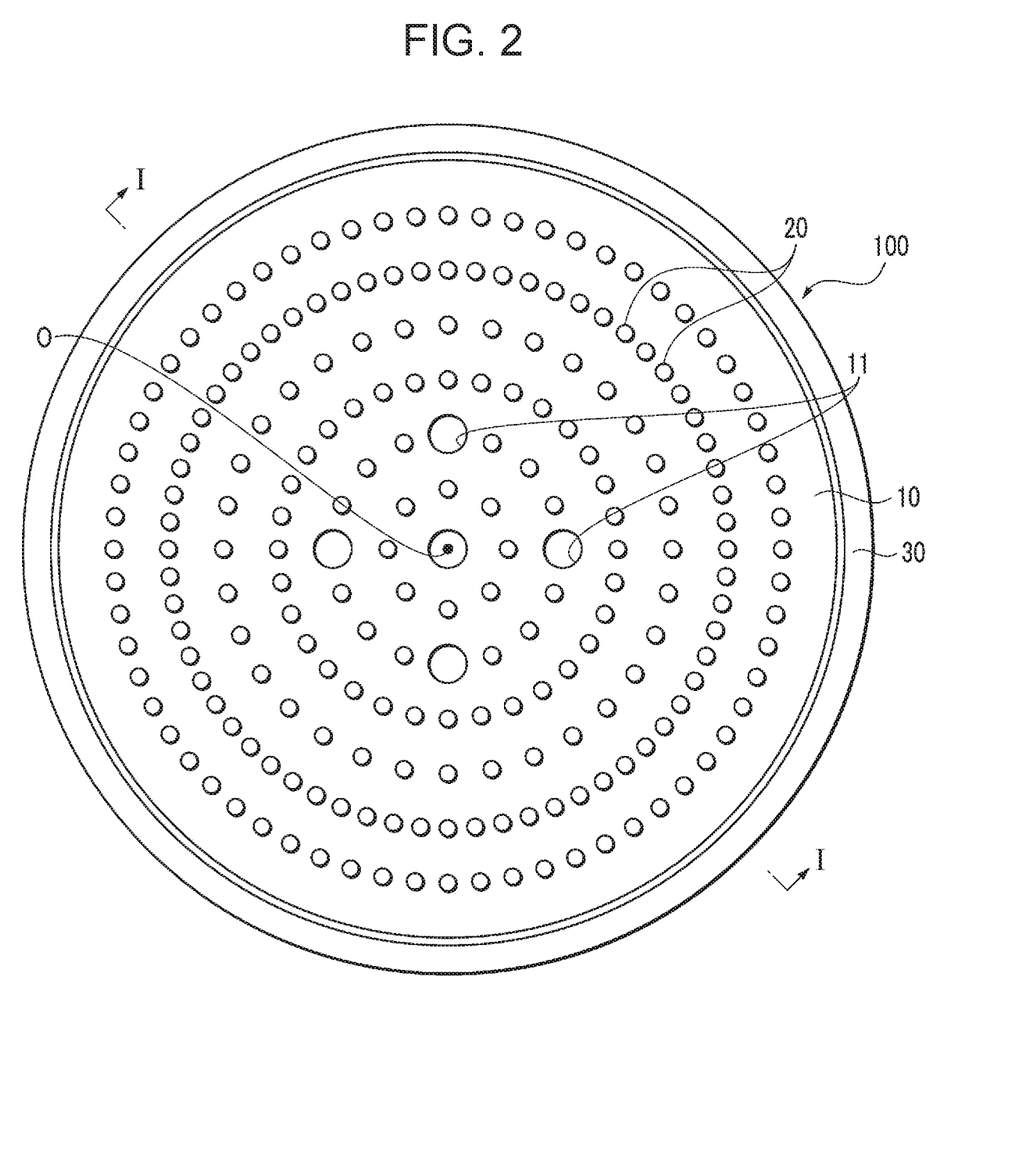
FIG. 2 is a schematic top view of the substrate holding device.

Referring to FIG. 2, in the present embodiment, the gas passages 11 have a plurality of (to be specific, five) openings 11a in the upper surface of the base body 10. One of the openings 11a is located at the center O of the upper surface of the base body 10. However, the number and the arrangement of the openings 11a are not limited to these. None of the openings 11a may be located at the center O of the base body 10.

A large number of protrusions 20 protrude from the upper surface of the base body 10. The large number of protrusions 20 may be regularly arranged in a triangular grid pattern, a square grid pattern, or the like. Alternatively, the protrusions 20 may be partially irregularly arranged so that the density of the distribution of the protrusions 20 varies in the circumferential direction or in the radial direction.

A loop-shaped protrusion 30 protrudes from the upper surface of an outer peripheral portion of the base body 10. The loop-shaped protrusion 30 supports the lower surface of an outer peripheral portion of the substrate W.

In the figures, in order to clearly illustrate the structures of the substrate holding devices 100, the shapes of the gas passages 11, the protrusions 20, and the loop-shaped protrusion 30 are appropriately modified. The aspect ratios of components shown in the sectional views and the ratios between the width, the height, and the distance between the components shown in the figures differ from those of actual ones. Although not illustrated, a lift-pin hole, a rib, or the like may be formed in/on the base body 10.

Figure 1:
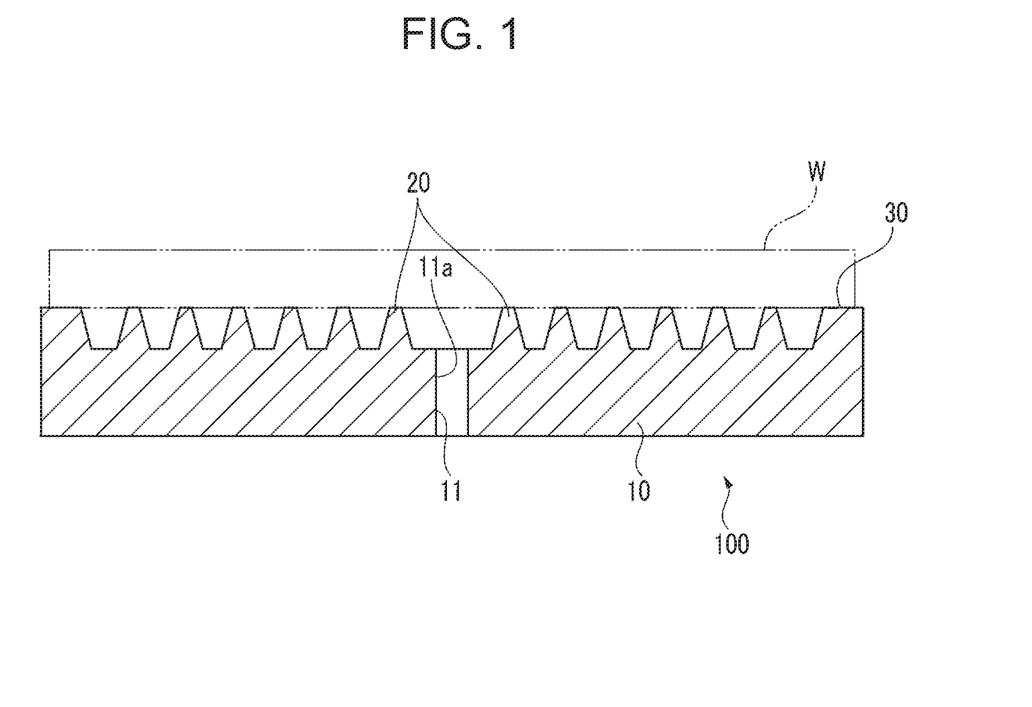
FIG. 1 is a schematic sectional view of a substrate holding device according to an embodiment of the present invention, taken along line I-I of FIG. 2.

Referring to FIG. 1, the entirety of each of the protrusions 20 has a conical frustum shape. The base angle is 70° or more and 85° or less, and preferably 75° or more and 80° or less. The protrusions 20, having such a sharp conical frustum shape, can be formed by laser processing, that is, by irradiating the upper surface of the base body 10 with a laser beam.

Laser processing is performed by using a laser processing machine including a laser oscillator. The type of the laser processing machine is not particularly limited. Any type of laser, such as a solid-state laser, a liquid laser, a gas laser, a semiconductor laser, or a fiber laser, may be used.

In the present invention, the term "conical frustum shape" not only refers to a conical frustum shape that is mathematically rigorously defined but also includes the meaning of substantially conical frustum shapes, such as those having rounded corners or irregular side surfaces.

In the present invention, "the base angle of the protrusion 20", which is formed by laser processing, is defined as the base angle of an isosceles trapezoid that has the same top, the same base, and the same area as a vertical cross section or a side view of each of the protrusion 20. The shapes of the protrusions 20 vary, and the shape of each of the protrusions 20 varies in accordance with the direction of the vertical cross section or the direction of the side view. Therefore, the base angle of the protrusion 20 in the present invention is an average value of the base angles of the plurality of protrusions 20.

The ratio of the total contact area between the substrate W and the protrusions 20 to the area of the substrate W is preferably 0.30% or less, and more preferably 0.15% or less.

The area of the top portion of each of the protrusions 20, that is, the contact area between the protrusion 20 and the substrate W is preferably 0.03 $mm^2$ or less, and more preferably 0.001 $mm^2$ or less. A base end portion of the protrusion 20 adjacent to the upper surface of the base body 10 may be rounded.

The protrusions 20 are arranged along concentric circles centered at the center O of the base body 10 so as to be spaced apart from each other. The center-to-center distance between the protrusions 20 that are located adjacent to each other is preferably 3.0 mm or less, and more preferably 2.0 mm or less. The protrusions 20 may be regularly arranged in a triangular grid pattern, a square grid pattern, or the like. Alternatively, the protrusions 20 may be partially irregularly arranged so that the density of the distribution of the protrusions 20 varies in the circumferential direction or in the radial direction.

The ratio of the height of each of the protrusions 20, that is, the protruding distance from the upper surface of the base body 10, to the maximum width of the contact area between the substrate W and the protrusion 20 is preferably 1 or more. For example, the height of the protrusion 20 is in the range of 50 μm to 200 μm. The surface roughness Ra of the top portion of the protrusion 20 (which contacts the substrate) is, for example, in the range of 0.01 μm to 0.50 μm.

In the present embodiment, the ratio of the total contact area between the substrate W and the protrusions 20 to the area of the substrate W is 0.15% or less. This is smaller than 0.3%, which is the smallest of the ratio in existing technologies. Therefore, it is possible to reduce the probability that particles adhere to the top surfaces of the protrusions 20.

When the contact area between the substrate W and the protrusions 20 is small as described above, the top portions of the protrusions 20 wear easily. Therefore, it may be necessary to polish the top portions more frequently.

In the present embodiment, each of the protrusions 20 has a sharp conical frustum shape having a base angle of 70° or more and 85° or less. Therefore, even when the top portions of the protrusions 20 are polished, an increase in the contact area between the substrate W and the protrusions 20 can be suppressed, and it is possible to reduce the probability that particles adhere to the top surfaces of the protrusions 20 after being polished. In existing technologies, because each of protrusions have a blunt conical frustum shape having a base angle of about 45°, the contact area between the protrusions and the substrate W changes considerably when the top portions of the protrusions are polished.

Since each of the protrusions 20 has a sharp conical frustum shape, the space between the substrate W and the base body 10 is larger than that of the existing technology described in PTL 1. Therefore, the space can be filled with a larger amount of gas, and reactivity can be increased. Moreover, if the inside of the space is a vacuum, it is possible to more strongly attract the substrate W to the base body 10 by vacuum.

The distance between the protrusions 20 is 3.0 mm or less. This is smaller than 4.0 mm, which is the smallest of the distance in existing technologies. Therefore, it is possible to reduce downward bending of the substrate W between the protrusions 20.

Accordingly, with the present embodiment, it is possible to reduce the surface irregularity of the substrate W and to increase the production yield compared with existing technologies.

Preferably, the distances between the protrusions 20 that are located adjacent to each other are the same. In this case, downward bending of the substrate W can be further reduced. However, the distances between the protrusions 20 that are located adjacent to each other need not be the same.

When the area of the top surface of each of the protrusion 20 having a sharp conical frustum shape is reduced, the probability that the protrusion 20 breaks is increased because the rigidity of the base end portion of the protrusion 20 is low.

Figure 3:
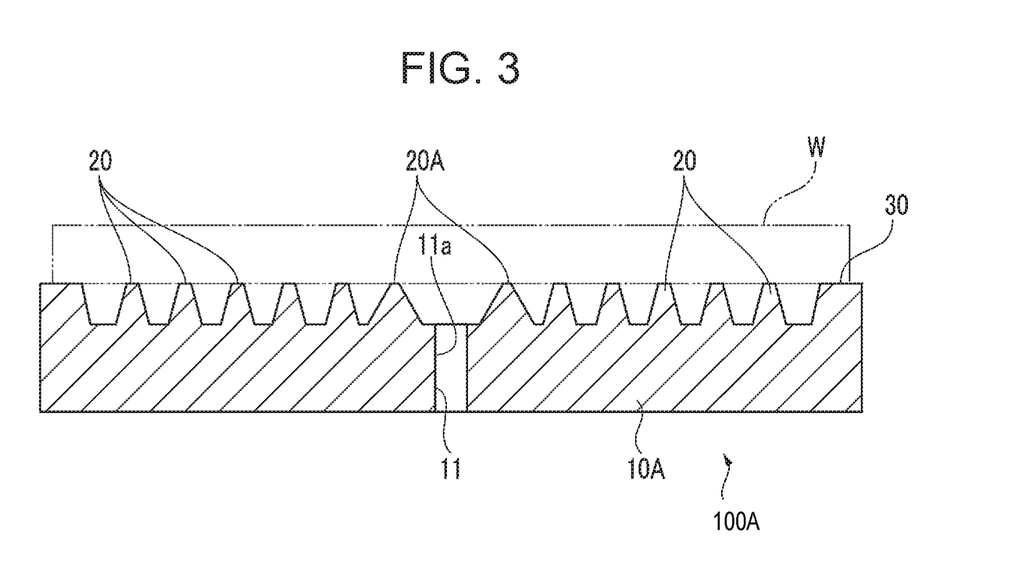
FIG. 3 is a schematic sectional view of a substrate holding device according to a modification of the embodiment of the present invention, corresponding to FIG. 1.

Therefore, as illustrated in FIG. 3, for a substrate holding device 100A including a base body 10A, preferably, at least some protrusions 20A have a blunt conical frustum shape having a large base angle. The protrusions 20A having a blunt conical frustum shape may be formed by abrasive blasting.

In this case, the protrusions 20A have higher rigidity, and therefore it is possible to prevent an increase in the probability that the protrusions 20A break and that the substrate W bends downward to a larger degree.

For example, in an initial stage after starting suction by using a vacuum sucking device, only a small number of protrusions 20A contact the substrate W, and a large pressure is applied to these protrusions 20A. Therefore, preferably, the base end portions of the protrusions 20A located around the gas passages 11 have larger cross-sectional area. As the protrusions 20 successively contact the substrate W after the protrusions 20A have contacted the substrate W, a pressure applied to the protrusions 20 is dispersed and becomes smaller than that applied to the protrusions 20A. Therefore, the protrusions 20 need not have a considerably high rigidity and may have a sharp conical frustum shape.

Figure 4:
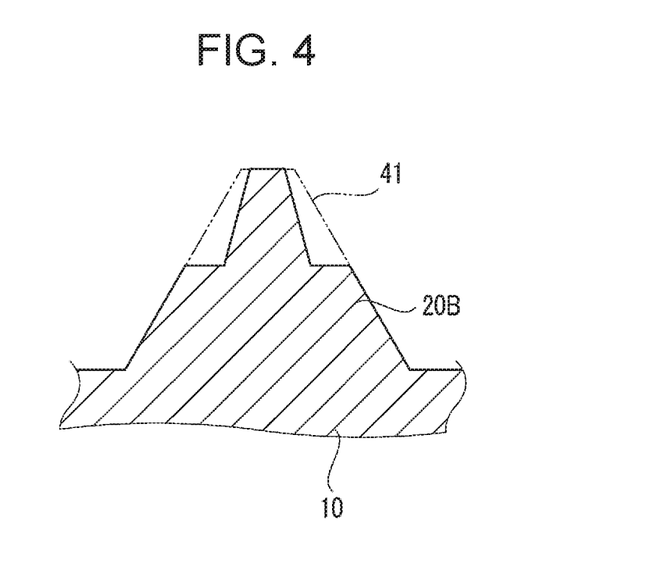
FIG. 4 is partial schematic sectional view illustrating an example of a method of manufacturing a substrate holding device.

For example, as illustrated in FIG. 4, each of the protrusions may be a protrusion 20B including a lower part that has a blunt conical frustum shape having a base angle of 45° or more and 70° or less and an upper part having a sharp conical frustum shape having a base angle of 70° or more and 85° or less.

In this case, since the upper part has a base angle of 70° or more and 85° or less, it is possible to suppress an increase in the contact area between the protrusions and the substrate W even when the top portions of the protrusions are polished.

Method of Manufacturing Substrate Holding Device

The base body 10 of the substrate holding device 100 is made, for example, through the following process. That is, a substantially disk-shaped compact is made from raw material powder, and a substantially disk-shaped sintered compact is made by sintering the compact. As the raw material powder, for example, high-purity silicon carbide powder (for example, with a purity of 97% or more) is used. As necessary, an appropriate amount of sintering additive may be added to the silicon carbide powder. Ceramic powder of another material, such as aluminum nitride powder or alumina powder, may be used as the raw material powder.

A plurality of protrusions 20 are formed by laser processing, that is, by irradiating the upper surface of the sintered compact with a laser beam. Gas passages 11 are formed in the sintered compact by abrasive blasting and a loop-shaped protrusion 30 and the like is formed on the sintered compact by abrasive blasting. Alternatively, the loop-shaped protrusion 30 may also be formed by laser processing. Moreover, the top surfaces of the plurality of protrusions 20 and the top surface of the loop-shaped protrusion 30 are polished. Thus, the base body 10 is manufactured.

The protrusions 20B, one of which is illustrated in FIG. 4, may be formed by forming a plurality of conical-frustum-shaped protruding portions 41, each having a base angle of 45° or more and 70° or less (shown by two-dot chain lines), on the upper surface of the sintered compact (base body 10) by abrasive blasting, and then forming a conical frustum shape, having a base angle of 70° or more and 85° or less, in an upper part of the conical-frustum-shaped protruding portions 41 by laser processing.

EXAMPLES

Hereinafter, the present invention will be specifically described in detail by using Examples and Comparative Examples of the present invention.

Examples 1 to 10

In Examples 1 to 10, SiC powder having a mean particle size of 10 μm (UF-10 made by H. C. Starck GmbH) was prepared as raw material powder. To the SiC powder, 2 weight % of graphite was added as a sintering additive.

The raw material powder was press-formed, CIP-formed, and sintered at an atmospheric pressure to obtain a sintered compact. The sintered compact was surface-ground, thereby obtaining a base body 10.

Next, the upper surface of the base body 10 was irradiated with a laser beam by using a fiber laser processing machine under the following irradiation conditions: output power of 50 W, a focus of 110 nm, a spot diameter of 30 μm, a frequency of 80 kHz, and a feed speed of 48 m/min. Thus, a large number of protrusions 20 were formed so as to be arranged in a 60-degree staggered pattern.

Regarding the protrusions 20 formed in this way, Table 1 shows the base angle, the height, and the diameter of the top surface of each of the protrusions 20; the central-to-center pitch of the protrusions 20; and the ratio of the contact area between the substrate W and the protrusions 20 to the area of the substrate W (hereinafter, referred to as the contact area ratio).

Figure 5:
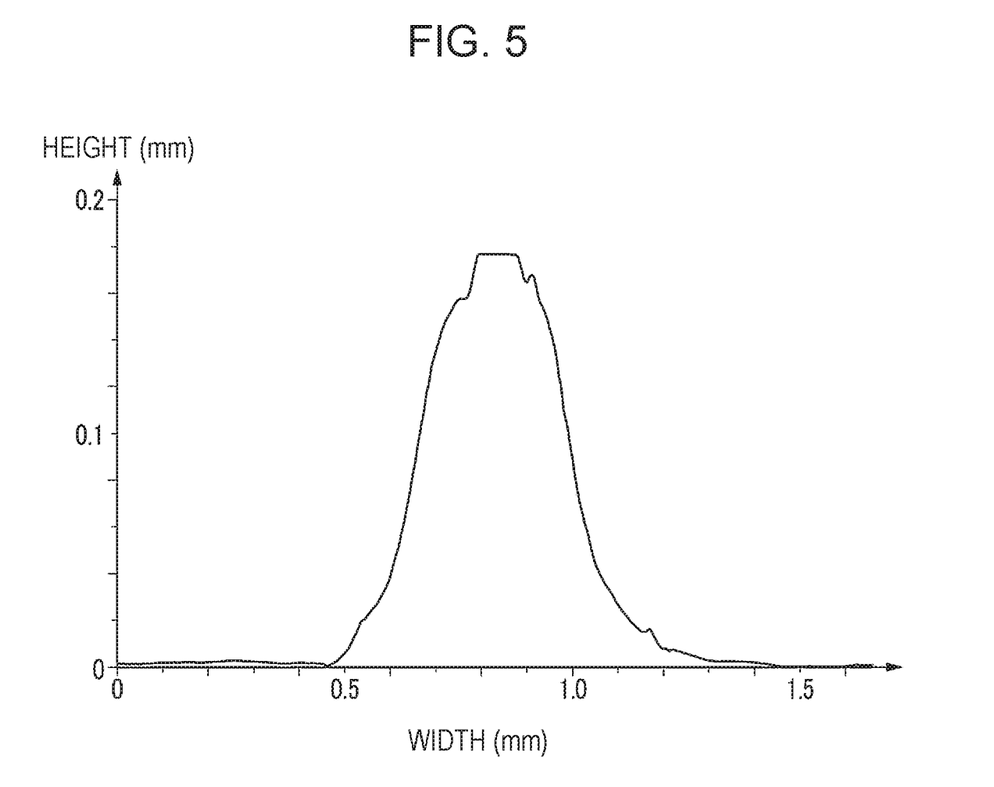
FIG. 5 shows a profile of an example of a protrusion according to Example 1.

FIG. 5 shows an example of a profile of a protrusion 20 formed according to Example 1. This profile is a cross-sectional profile measured by using a 3-D profilometer.

In Examples 2 and 4, the top portions of the protrusions 20 of Examples 1 and 3 were each cut by 0.02 mm.

In Examples 1 to 10, the substrate W was placed on the top surfaces of the protrusions 20, and the flatness of the substrate W was measured. Table 1 shows the results of the measurement.

In Examples 1 to 10, the number of particles adhered to the back surface of the substrate W (contact surface between the substrate W and the protrusions 20) was counted. Table 1 shows the results of the counting.

In Examples 1 to 8, the contact area ratio was in the range of 0.10% to 0.24%, which was small; the flatness of the substrate W was in the range of 0.02 μm to 0.05 μm, which was good; and the number of particles was less than 100, which was small.

In Example 9, the contact area ratio was 0.07%, which was small; and the number of particles was 80. However, the flatness of the substrate W was 0.32 μm, which was not so good.

In Example 10, the contact area ratio was 0.40%, which was a little large; and the flatness of the substrate W was 0.05 μm, which was good. However, the number of particles was 187, which was a little large.

Example 11

In Example 11, a base body 10 was made in the same way as in Examples 1 to 10.

A mask, in which holes each having a diameter of 0.1 mm had been formed, was affixed to the upper surface of the base body 10 so that protrusions would be arranged at a pitch of 3.00 mm in a 60-degree staggered pattern. Then, abrasive blasting was performed on the base body 10.

Abrasive blasting was finished when the height of the center of each of the conical-frustum-shaped protruding portions 41 became 0.20 mm. Then, the mask was removed, and the workpiece was ultrasonic-cleaned.

The protruding portions 41, which had been formed by abrasive blasting, were additionally processed by irradiating the protruding portions 41 with a laser beam, thereby forming a large number of protrusions 20B.

Table 1 shows the base angle, the height, the diameter of the top surface, the central-to-center pitch, and the contact area of the protrusions 20B, which were formed in this way. In the column of Table 1 showing the base angle of Example 11, 45° is the base angle of a lower part of the protrusion 20B and 70° is the base angle of an upper part of the protrusion 20B formed by laser processing.

In the same way as in Examples 1 to 10, the flatness of the substrate W was measured and the number of particles was counted. Table 1 shows the result of the measurement/counting.

In Example 11, the contact area ratio was 0.23%, which was small; the flatness of the substrate W was 0.05 μm, which was good; and the number of particles was 95, which was small.

TABLE 1

| | | Protrusion | | | | | | |
| --- | --- | --- | --- | --- | --- | --- | --- | --- |
| | Processing Condition | Base Angle (°) | Height (mm) | Diameter of Top Surface (mm) | Pitch (mm) | Contact Area Ratio (%) | Flatness (μm) | Number of Particles |
| Example 1 | laser | 85 | 0.20 | 0.10 | 3.00 | 0.10 | 0.05 | 82 |
| Example 2 | laser | 85 | 0.18 | 0.10 | 3.00 | 0.11 | 0.05 | 81 |
| Example 3 | laser | 70 | 0.20 | 0.10 | 3.00 | 0.10 | 0.05 | 87 |
| Example 4 | laser | 70 | 0.18 | 0.11 | 3.00 | 0.12 | 0.05 | 86 |
| Example 5 | laser | 85 | 0.20 | 0.10 | 2.50 | 0.14 | 0.04 | 90 |

TABLE 1-continued

|  | Processing Condition | Protrusion | | | | | | |
|---|---|---|---|---|---|---|---|---|
|  |  | Base Angle (°) | Height (mm) | Diameter of Top Surface (mm) | Pitch (mm) | Contact Area Ratio (%) | Flatness (μm) | Number of Particles |
| Example 6 | laser | 85 | 0.20 | 0.10 | 2.00 | 0.19 | 0.03 | 94 |
| Example 7 | laser | 85 | 0.20 | 0.10 | 1.50 | 0.24 | 0.02 | 96 |
| Example 8 | laser | 85 | 0.20 | 0.10 | 3.00 | 0.23 | 0.05 | 95 |
| Example 9 | laser | 85 | 0.20 | 0.10 | 3.60 | 0.07 | 0.32 | 80 |
| Example 10 | laser | 85 | 0.20 | 0.20 | 3.00 | 0.40 | 0.05 | 187 |
| Example 11 | blasting + laser | 45-70 | 0.20 | 0.10 | 3.00 | 0.23 | 0.05 | 95 |

Comparative Examples 1 and 2

In Comparative Examples 1 and 2, a base body 10 was made in the same way as in Examples 1 to 10.

A mask, in which holes each having a diameter of 0.40 mm had been formed, was affixed to the upper surface of the base body 10 so that protrusions would be arranged at a pitch of 3.00 mm in a 60-degree staggered pattern. Then, abrasive blasting was performed on the base body 10.

Abrasive blasting was finished when the height of the center each of the protrusions became 0.20 mm. Then, the mask was removed, and the workpiece was ultrasonic-cleaned.

In Comparative Example 2, the top portions of the protrusions, which had been formed in this way, were each cut by 0.02 mm.

Table 2 shows the base angle, the height, the diameter of the top surface, the central-to-center pitch, and the contact area of the protrusions, which were formed in this way.

In the same way as in Examples 1 to 10, the flatness of the substrate W was measured and the number of particles was counted. Table 2 shows the result of the measurement/counting.

In Comparative Examples 1 and 2, the contact area ratios were 1.60% and 1.93%, which were large; the flatness of the substrate W was 0.05 μm, which was good; but the numbers of particles were 267 and 258, which were very large.

TABLE 2

|  | Processing Condition | Protrusion | | | | | | |
|---|---|---|---|---|---|---|---|---|
|  |  | Base Angle (°) | Height (mm) | Diameter of Top Surface (mm) | Pitch (mm) | Contact Area Ratio (%) | Flatness (μm) | Number of Particles |
| Comparative Example 1 | blasting | 45 | 0.20 | 0.40 | 3.00 | 1.60 | 0.05 | 267 |
| Comparative Example 2 | blasting | 45 | 0.18 | 0.44 | 3.00 | 1.93 | 0.05 | 258 |

What is claimed is:

1. A device for holding a substrate comprising:
a base body having a flat plate-like shape and including an upper surface and a plurality of protrusions including a first protrusion and a second protrusion, the plurality of protrusions protruding from the upper surface, the base body defining a gas passage that opens in the upper surface;
wherein at least an upper part of the first protrusion has a conical frustum shape with a base angle between 70° and 85°;
wherein the second protrusion is located around the gas passage;
wherein the base angle of the second protrusion is smaller than the base angle of the first protrusion; and
wherein a cross-sectional area of a base end portion of the second protrusion is larger than a cross-sectional area of a base end portion of the first protrusion.

2. The device according to claim 1, each of the plurality of protrusions including a top surface for contacting the substrate,
wherein a ratio of a height of each of the protrusions to a maximum width of the top surface is 1 or more, a ratio of a total contact area between the substrate and the plurality of protrusions to an area of the substrate is 0.30% or less, and center-to-center distances between adjacent protrusions are 3.0 mm or less.

3. A device for holding a substrate comprising:
a base body having a flat plate-like shape and including an upper surface and a plurality of protrusions including a first protrusion and a second protrusion, the plurality of protrusions protruding from the upper surface, the base body defining a gas passage that opens in the upper surface;
wherein at least an upper part of the first protrusion has a conical frustum shape with a base angle between 70° and 85°;
wherein the second protrusion is located around the gas passage;
wherein the base angle of the second protrusion is smaller than the base angle of the first protrusion;

wherein a cross-sectional area of a base end portion of the second protrusion is larger than a cross-sectional area of a base end portion of the first protrusion; and wherein the first protrusion is formed by laser processing.

* * * * *